United States Patent [19]

Temple

[11] Patent Number: 4,809,047

[45] Date of Patent: Feb. 28, 1989

[54] INSULATED-GATE SEMICONDUCTOR DEVICE WITH IMPROVED BASE-TO-SOURCE ELECTRODE SHORT AND METHOD OF FABRICATING SAID SHORT

[75] Inventor: Victor A. K. Temple, Clifton Park, N.Y.

[73] Assignee: General Electric Company, Schenectady, N.Y.

[21] Appl. No.: 98,756

[22] Filed: Sep. 17, 1987

Related U.S. Application Data

[63] Continuation of Ser. No. 810,809, Dec. 19, 1985, abandoned, which is a continuation of Ser. No. 529,198, Sep. 6, 1983, abandoned.

[51] Int. Cl.⁴ .............................................. H01L 29/78
[52] U.S. Cl. .................................... 352/23.4; 357/20; 357/38; 357/55; 357/67; 357/86; 357/89
[58] Field of Search .................. 357/23.3, 23.4, 23.5, 357/38, 55, 67, 86, 89, 20

[56] References Cited

U.S. PATENT DOCUMENTS

| | | |
|---|---|---|
| 3,697,830 | 10/1972 | Dale . |
| 4,364,073 | 12/1982 | Becke et al. . |
| 4,374,455 | 2/1983 | Goodman ........................ 29/571 |
| 4,417,385 | 11/1983 | Temple .......................... 29/571 |
| 4,443,931 | 4/1984 | Bauga et al. ................... 148/187 |
| 4,503,598 | 3/1985 | Vora et al. ..................... 357/23.4 |
| 4,516,143 | 5/1985 | Cove ............................. 357/23.3 |
| 4,532,534 | 6/1985 | Ford et al. . |
| 4,587,713 | 5/1986 | Goodman et al. ............... 357/23.4 |

FOREIGN PATENT DOCUMENTS

| | | | |
|---|---|---|---|
| 2136509 | 11/1972 | Fed. Rep. of Germany | 357/23.4 |
| 52-23277 | 2/1977 | Japan | 357/23.4 |
| 54-1557 | 1/1979 | Japan | 357/23.4 |

*Primary Examiner*—Joseph E. Clawson, Jr.
*Attorney, Agent, or Firm*—Robert Ochis; James C. Davis, Jr.; Marvin Snyder

[57] ABSTRACT

Insulated-gate semiconductor devices, such as MOSFETs or IGTs, include an implant shorting region adjoining both base and source regions with the implant shorting region being conductively coupled to the source electrode so as to implement a base-to-source electrode short. The implant shorting region can be formed without a specially-aligned mask by utilizing the gate electrode as an implant mask.

26 Claims, 6 Drawing Sheets

IMPLANT AND DRIVE DOPANT

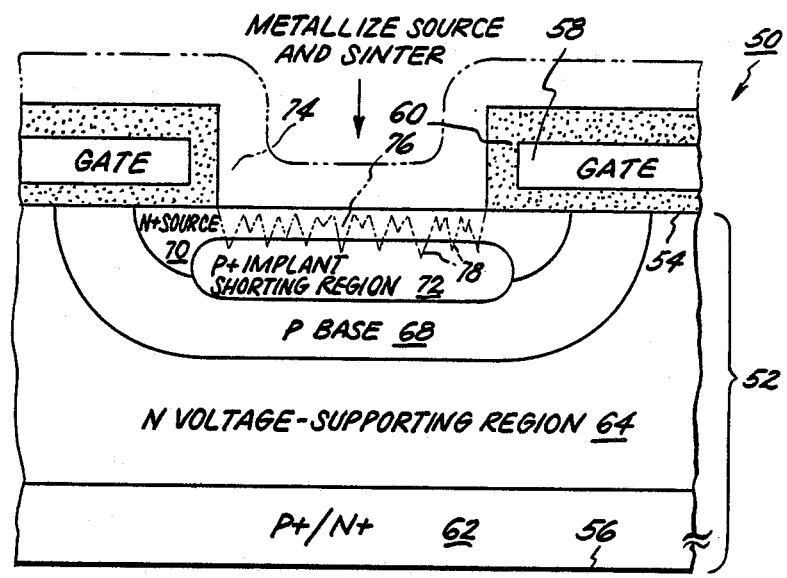
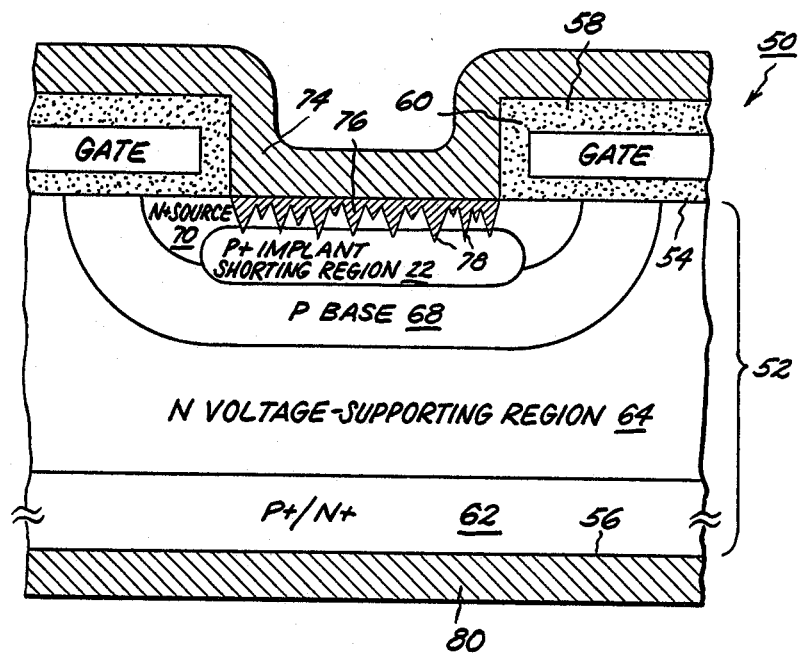

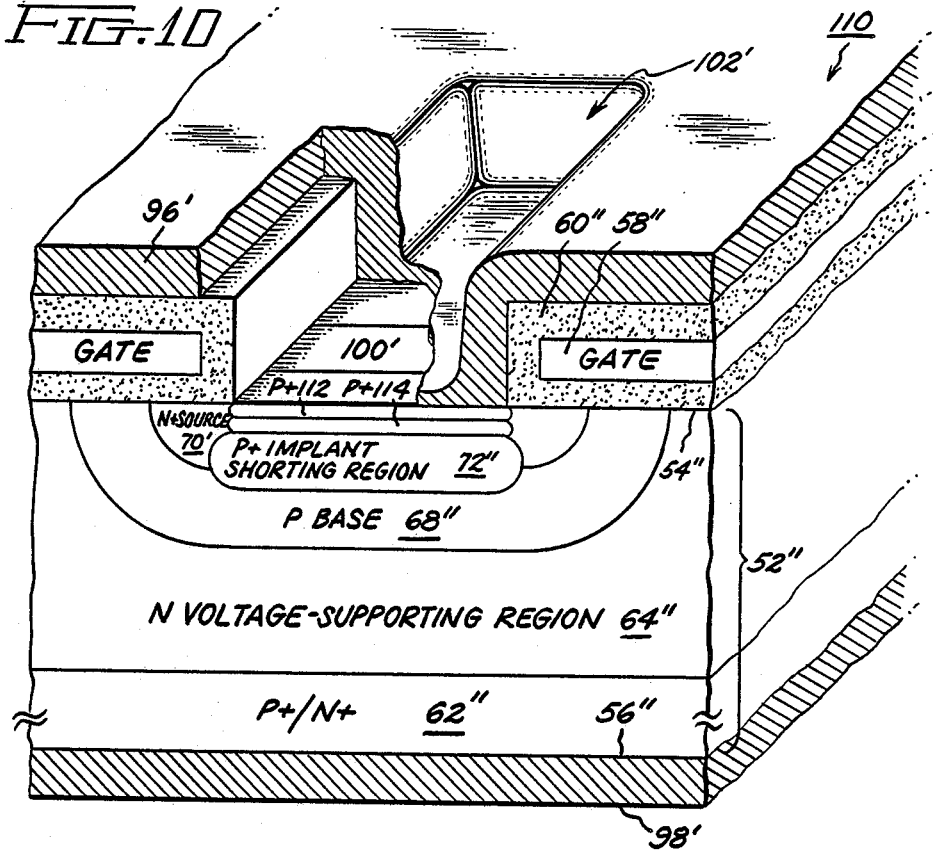
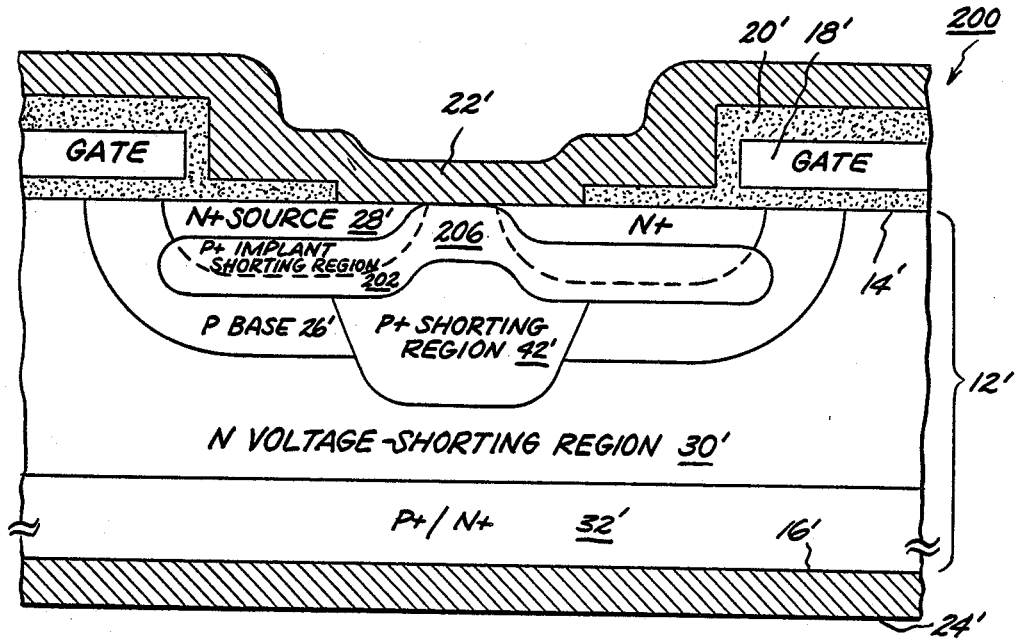

INSULATED-GATE SEMICONDUCTOR DEVICE WITH IMPROVED BASE-TO-SOURCE ELECTRODE SHORT AND METHOD OF FABRICATING SAID SHORT

This application is a continuation of application Ser. No. 810,804 filed Dec. 19, 1985 now abandoned, which is a continuation of application Ser. No. 529,198 filed Sept. 6, 1983 now abandoned.

BACKGROUND AND SUMMARY OF THE INVENTION

The present invention relates to an insulated gate semiconductor device having a base-to-source electrode short and to a method of fabricating such short.

Insulated-gate semiconductor devices are devices employing a gate, or control electrode, insulatingly spaced from semiconductor material, for altering the conductivity of the semiconductor material beneath the gate. Typical insulated-gate devices include Metal-Oxide-Semiconductor Field-Effect Transistors (MOSFETs), which are well-known devices, and Insulated Gate Transistors (IGTs), (formerly designated "Insulated Gate Rectifiers") such as described in an article by B. J. Baliga et al., "The Insulated Gate Rectifier (IGR): A New Power Switching Device", IDEM (December 1982), pages 264–267. Both MOSFETs and IGTs are typically comprised of a multitude of repeated, individual "cells", with device current-carrying capability increasing as cell size is made smaller.

A base-to-source electrode short is typically employed in MOSFETs and IGTs and, most commonly, comprises a portion of the source electrode electrically shorting together a "P", or moderately-doped, P-conductivity type, base region and an "N+", or highly-doped, N-conductivity type, source region. This helps to ensure that the base-to-source P-N junction between the P base region and the N+ source region does not become forward biased (due to hole current in the P+ region, for example) to such an extent that the N+ source commences electron injection into the P base region, across the base-to-source P-N junction. Such electron injection is deleterious to both MOSFETs and IGTs. In an IGT, for example, such electron injection results in the device latching into an "on", or current-conducting state, as in a thyristor, with attendant loss of gate control over device current.

Even when using the foregoing base-to-source electrode short of the prior art, hole current in the P base region may still cause a voltage drop along the base-to-source P-N junction which is sufficient to result in undesired electron injection by the N+ source region. One prior art technique directed to minimizing the hole current voltage drop in the P base region, and thus the likelihood of undesired electron injection by the N+ source region, is to form, through the use of a specially aligned mask, a "P+", or highly-doped, P-conductivity type, shorting region in a selected portion of the P base region adjacent the base-to-source P-N junction. Hole current that flows in the P+ shorting region accordingly creates only a low voltage drop therein and is thus less likely to result in undesired electron injection by the N+ source region.

A drawback of the foregoing technique for minimizing the hole current voltage drop along the base-to-short P-N junction is in the requirement for a specially-aligned mask in forming the P+ shorting region. This significantly adds to fabrication expense and necessitates a larger cell size, resulting in a reduced current-carrying capability for the device.

Accordingly, it is an object of the present invention to provide an insulated-gate semiconductor device with a highly effective base-to-source electrode short.

A further object of the invention is to provide an insulated-gate semiconductor device having a base-to-source electrode short and having a reduced cell size compared to prior art devices.

Another object of the invention is to provide a semiconductor device having a base-to-source electrode short that can be fabricated with only a marginal increase in fabrication complexity and cost.

A still further object of the invention is to provide a method of fabricating an improved shorting region in a semiconductor device having a base-to-source electrode short.

In accordance with a preferred form of the invention, there is provided a semiconductor device with an improved base-to-source electrode short. The device comprises a semiconductor wafer having a substantially-planar upper surface and including: an N voltage-supporting layer; a P base region overlying the N voltage-supporting layer and having a portion terminating in proximity to the wafer upper surface; and an N+ source region overlying the P base region. The semiconductor device includes a gate above the wafer and insulatingly spaced therefrom and a source electrode situated above the wafer and conductively coupled to the N+ source region. A P+ implant shorting region is included in the wafer with at least the major portion of the upper surface thereof being situated beneath the plane of the wafer upper surface source and P base regions. The implant shorting region adjoins the N+ source and base regions, has a higher conductivity than the P base region and is conductively coupled to the source electrode so as to complete the short between the P base region and the source electrode.

In accordance with a further, preferred form of the invention, there is provided a method of fabricating an implant shorting region in an insulated-gate semiconductor device. The method includes the step of providing a semiconductor wafer having a substantially-planar upper surface and including, in successively adjoining relationship, an N+ source region, a P base region, and an N voltage-supporting layer. A gate insulatingly spaced from the wafer is formed atop the wafer. The gate is utilized as an integral part of an implant mask while implanting into the wafer a P+ implant shorting region at a sufficiently high energy level that the P+ implant shorting region is located, at least in major part, beneath the wafer upper surface and adjoining both the N+ source and P base regions. A source electrode is conductively connected to the N+ source region and the P+ implant shorting region.

BRIEF DESCRIPTION OF THE DRAWINGS

The features of the invention deemed to be novel are defined in the appended claims. The invention itself, however, as to both organization and method of operation, together with further objects and advantages thereof, will be better understood by referring to the following description in connection with the accompanying drawing figures, in which:

FIG. 4 is a schematic, cross-sectional view of a further processing step of the semiconductor device in accordance with the invention;

FIG. 5 is a schematic, cross-sectional view of the completed semiconductor device of the invention;

FIG. 10 is a schematic, tridimensional view in cross section of another semiconductor device in accordance with the present invention, with a portion of the source electrode broken away to facilitate viewing of interior details of the device; and FIG. 11 is a schematic, cross-sectional view of a semiconductor device in accordance with a still further embodiment of the present invention.

DESCRIPTION OF THE PREFERRED EMBODIMENTS

Figure 1:
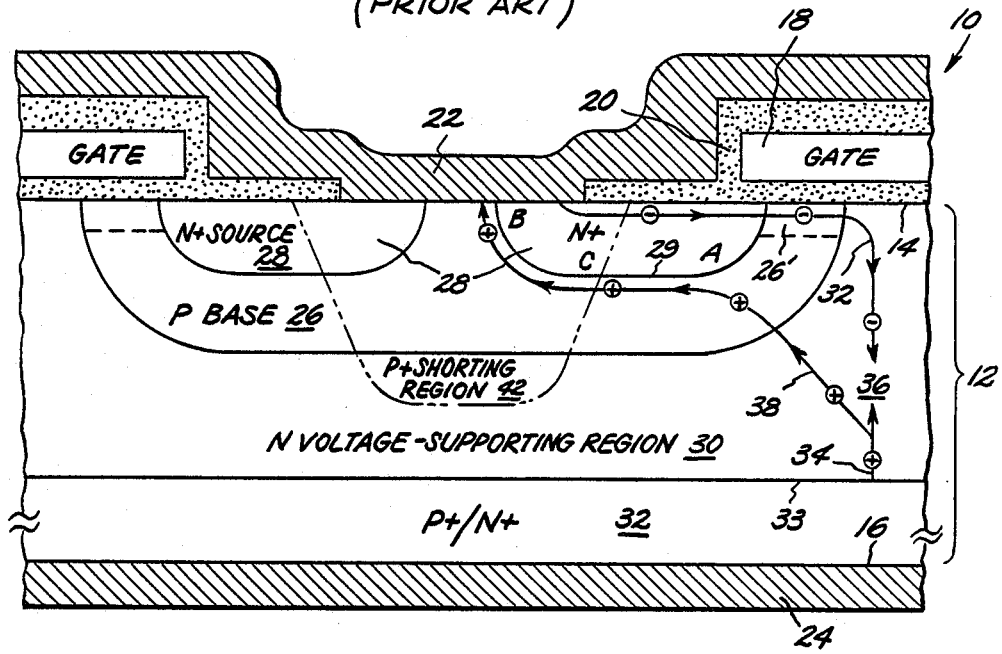
FIG. 1 is a schematic, cross-sectional view of a prior art semiconductor device.

To aid in understanding the electrical function performed by the implant shorting region of the present invention, a prior art semiconductor device is illustrated and described in connection with FIG. 1, which depicts a cross-section of a semiconductor device 10. Device 10 includes a semiconductor wafer 12 with substantially planar upper and lower surfaces 14 and 16, respectively. A gate 18, such as polysilicon highly doped with N-conductivity type dopant impurities, is insulatingly spaced from wafer 12 by the lower portion of insulation layer 20, which is illustrated in simplified form as comprising one layer, but which may include, in actuality, one or more layers of silicon dioxide and silicon nitride, by way of example. Also included in device 10 are an upper or source electrode 22 and a lower or drain electrode 24.

Wafer 12 includes a P base region 26, which when viewed from above, may be rectangular, circular, or elongated, by way of example. Gate 18 overlies portion 26' of P base 26 and, thus, when viewed from above, has the same shape, in plan view, as the periphery of P base 26. Overlying P base region 26 is an N+ source region 28 that forms a P-N junction 29 therewith. N+ source region 28 adjoins source electrode 22 and typically forms a closed loop within P base region 26 of the same shape as the periphery of P base region 26 when viewed from above; accordingly, the right hand N+ region is part of the loop of N+ source region 28. An N voltage-supporting region 30 underlies P base region 26 and, in turn, overlies a lowermost region 32, which, in turn, overlies drain electrode 24. Region 32 as illustrated, may be highly-doped to P conductivity type or to N-conductivity type, the former resulting in device 10 constituting an IGT and the latter resulting in device constituting a MOSFET. The electrode source device 10 typically comprises a cell that is repeated many times in a completed device 10, with the cells sharing a common gate 18, a common source electrode 22, and a common drain electrode 24.

The operation of device 10 as an IGT, that is, with lowermost region 32 being of P-conductivity type, is now considered. With gate 18 biased with a sufficiently high voltage (with respect to source electrode 22), portion 26' of P base region 26, adjacent to gate 18, becomes depleted of holes (or positive charge current carriers) and populated with electrons so as to form what is known as an "inversion" channel that is conductive to electrons. Then, with drain electrode 24 biased more positively than source electrode 22, electron current 32 (shown schematically) flows from source electrode 22 to N voltage-supporting region 30 via N+ source region 28 and the inversion channel in portion 26'. Holes are injected into N voltage-supporting layer 30 by P+ lowermost region 32 via a hole current path 34 when P-N junction 33, extant between these layers, becomes sufficiently forward biased (about 0.5 volts for silicon). A portion of hole current 34 recombines with electron current 32 where their paths intersect (for example, at location 36), and this recombination accounts for the bulk of device current. However, a fraction of hole current 34, as represented by hole current path 38 (shown schematically), does not recombine with electrons from electron current path 32 but instead flows to source electrode 22 via P base region 26. Hole current 38 causes a voltage drop along P-N junction 29, between locations A and B, and if this voltage exceeds about 0.5 volts for silicon devices, N+ source region 28 is induced to inject electrons into P base region 26, and device 10 thereupon latches into an on state, in the same way as a thyristor, with attendant loss of control of device current by gate 18.

To reduce the voltage drop along P-N junction 29 caused by hole current 38, a P+ shorting region 42, shown in phantom, is provided in wafer 12 in accordance with the prior art. Region 42 is highly conductive to holes, and, consequently, the voltage drop along P-N junction 29 from location C to location B is extremely low. The implementation of P+ shorting region 42 has two significant disadvantages, however. First a specially-aligned mask (not shown) is typically used in the process of fabricating P+ shorting region 42. Second, P base region 26 must be sufficiently large to accommodate alignment tolerance for the foregoing mask, resulting in a larger cell size and lower current-carrying capability in device 10. These disadvantages are avoided by the present invention, which is described in connection with FIG. 2 and the succeeding drawings figures.

Figure 2:
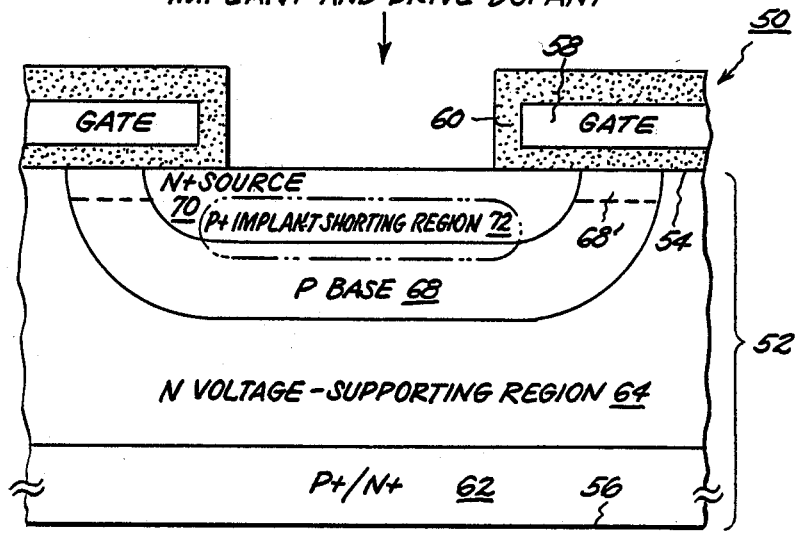
FIG. 2 is a schematic cross-sectional view of a fabrication step of a semiconductor device in accordance with the present invention.

Considering now FIG. 2, there is illustrated in cross-section one step in the fabrication process of a semiconductor device 50 in accordance with the present invention. Device 50 includes a wafer of semiconductor material 52, such as silicon, a gate 58 such as polysilicon highly doped with N-conductivity type impurities, and an insulating layer 60, the lower portion of which insulatingly spaces gate 58 from wafer 52. Insulating layer 60 is illustrated in simplified form as comprising only one layer, but may, in actuality comprise one or more layers of silicon dioxide and silicon nitride, by way of example. Wafer 52 includes a lowermost region 62, which may be of P-conductivity type (for an IGT) or N-conductivity type (for a MOSFET); an N voltage-supporting layer 64 overlying lowermost layer 62; and a P base region 68 overlying N voltage-supporting layer 64 and having a portion 68' terminating in proximity to gate 58 and, which, as viewed from above, may be rectangular, circular or elongated, by way of example. Wafer 52 further includes an N+ source region 70 overlying P base region 68, with the uppermost portion of region 70 terminating at wafer upper surface 54. With P base portion 68' terminating at wafer upper surface 54, as illustrated, device 50 constitutes a normally-off device in that the gate 58 must be biased in order to turn on device 50. If, in an alternative embodiment, an N-conductivity region (not shown) were interposed between P base portion 68' and wafer upper surface 54 and were interconnected with both N voltage-supporting region 64 and N+ source region 70, device 50 would constitute a normally-on device; that is, electron current would flow through such N-conductivity region unless gate 58 were appropriately biased so as to deplete the N-conductivity type region of electrons. The portion of the device occupied by the channel when present may be referred to as a channel region in both the normally-off and the normally-on forms of the device. This channel region is within the base region in the normally-off device and between the base region and the surface 54 in the normally-on device.

In accordance with the present invention, P+ implanted or implant shorting region 72 is formed in wafer 52 by implanting a P-conductivity type dopant through wafer upper surface 54 while utilizing gate 58 and the portion of insulating layer 60 thereabove as an implant mask. Accordingly, without the need for a specially-aligned mask, P+ implant shorting region 72 can be readily formed and, advantageously permits a small-sized P base region 68 as viewed from above since P base region 68 need not be made large in order to accommodate an alignment tolerance for a specially-aligned mask. Consequently, device 50 can have a smaller cell size, resulting in greater current-carrying capability thereof. P+ implant shorting region 72 is situated between N+ source region 70 and P base region 68. P+ shorting region 72 may extend downwardly into P base region 68 more so than as illustrated (FIG. 2), resulting in a relatively wide margin of tolerance in selecting a suitable implant energy for forming such implant shorting region.

Figure 3:
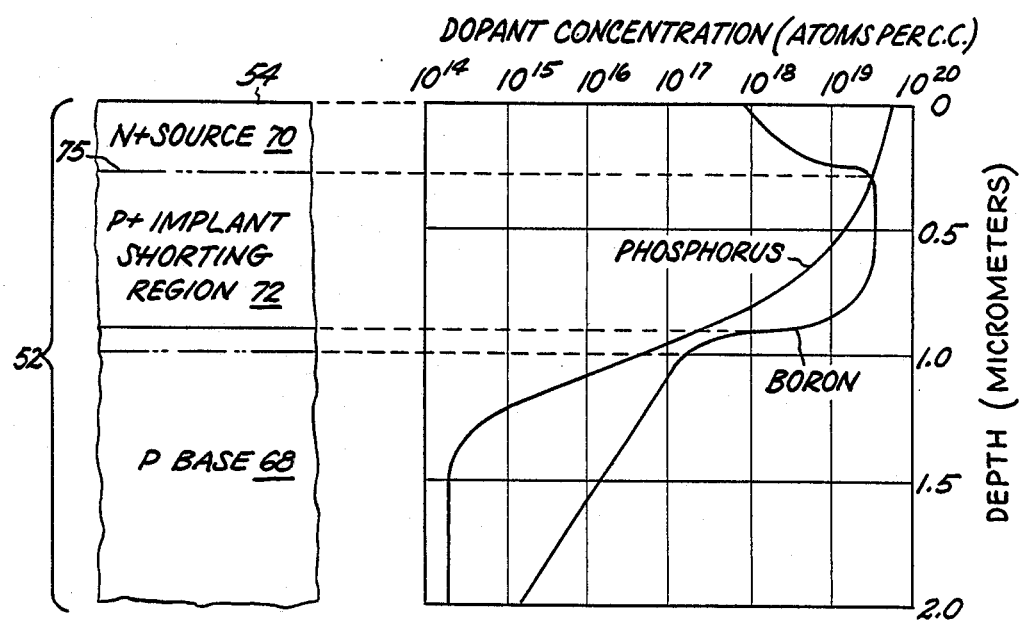
FIG. 3 is a detailed view of a portion of the semiconductor device of FIG. 2 together with a dopant profile graph for such detail view.

An exemplary procedure for forming P+ implant shorting region 72 is now described in connection with FIG. 3, which depicts in an enlarged detail view the center portion of P+ implant shorting region 72 of FIG. 2 2, together with adjacent N+ source region 70 and P base region 68. FIG. 3 further depicts a dopant concentration profile for both P-conductivity and N-conductivity type dopants, with the indicated depth being the depth into wafer 52 from wafer upper surface 54. Boron constitutes the preferred P-conductivity type dopant used to form P+ implant shorting region 72 and also P base region 68, while phosphorus constitutes the preferred N-conductivity type dopant used to form N+ source region 70. The boron dopant should overcome the phosphorus dopant at a location within the original N+ source region 70 or counter-dopes that portion of the source region 70 to make it P type, as at location 75, so that P+ implant shorting region 68 directly adjoins and converts a portion of the originally formed N type source region to P type conductivity N+ source region 70.

The boron doping profile of P+ implant shorting region 72 as shown in FIG. 3 can be achieved, with the phosphorus dopant profile as shown, for example, by implanting boron dopant at a high implant energy of 190K electron volts, for example, with a dopant concentration of $2 \times 10^{15}$ dopant atoms per cubic cm., at least for a silicon device. The reason that the implant energy should be high is to prevent P+ implant shorting region 72 from extending laterally into portion 68' of P base region 68 after the dopant for region 72 is "driven" or diffused by a subsequent heating step of wafer 52. Thus, the required bias voltage on gate 58 for inverting portion 68' of P base region 68 is not affected by the formation of P+ implant shorting region 72. Additionally, it is desirable that the total thickness of gate 58 (FIG. 2) and the portion of insulating layer 60 (FIG. 2) atop gate 58 be sufficient to prevent the boron dopant from reaching the portion of insulating layer 60 beneath gate 58. This preserves unchanged by the boron implantation the required bias voltage on gate 58 for inverting portion 68' of P base region 68.

After formation of P+ implant shorting region 72, the thus-formed device 50, as illustrated in FIG. 4, is provided with source metallization 74, shown in phantom, such as aluminum. In accordance with an aspect of the present invention, the source metallization 74 is then sintered at a sufficiently high temperature for a sufficient period of time to result in the formation of a metal-semiconductor eutectic composition 76, shown in phantom. This composition 76 includes downwardly-extending spikes 78, conductively connecting P+ implant shorting region 72 to source metallization 74 and also connecting N+ source region 70 to source metallization 74. By way of example, when using aluminum for source electrode 74 and silicon for wafer 52, a suitable sintering time for forming eutectic composition 76 is about 30 to 90 minutes with a sintering temperature in the range from about 500° C. to 550° C. Spikes 78 of eutectic composition 76 preferably do not penetrate through P+ shorting region 72 and into P base region 68, since this would detrimentally lower the breakdown voltage of device 50.

Device 50 when completed appears as shown in FIG. 5, and includes beneath lowermost region 62 a drain electrode 80, which may be formed at any convenient point in the fabrication process for device 50, as will be apparent to those skilled in the art.

Figure 6:
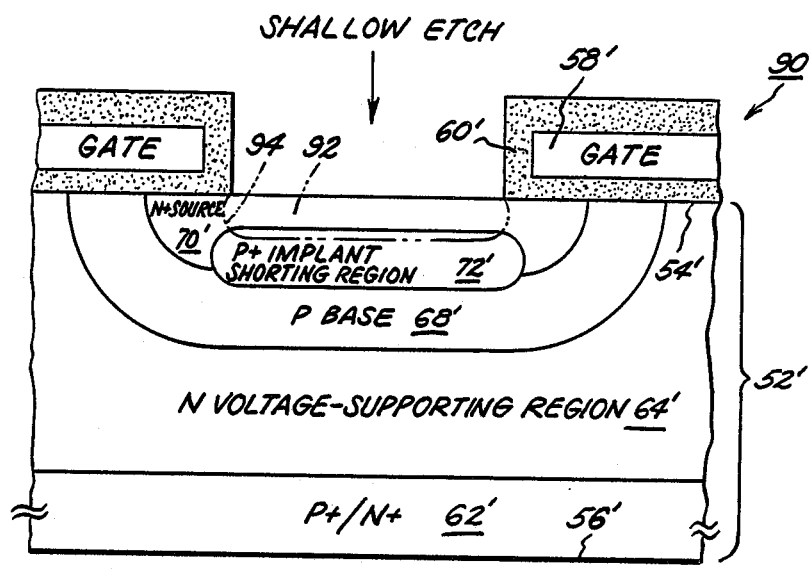
FIG. 6 is a schematic, cross-sectional view of a processing step of a further semiconductor device in accordance with the present invention.

Turning now to FIG. 6, a semiconductor device 90 in accordance with a further embodiment of the invention is illustrated after a P+ implant shorting region 72' has been formed. The thus-formed device 90 corresponds to device 50 of FIG. 2 after P+ implant shorting region 72 has been formed therein; accordingly, portions of device 90 and of device 50 having like reference numerals constitute like parts.

In accordance with the processing step illustrated in FIG. 6, a shallow etch of a portion of N+ source region 70' removes an area of semiconductor material 92, shown in phantom, from wafer upper surface 54' to at least the upper portion of P+ implant shorting region 72'. By way of example, a directional etch process, such as reactive ion etching, removing between about 0.25 and 1.0 micrometers of semiconductor material 92, for example, would be suitable. If, however, a directional etch is not used and also if source metallization (not shown) is to make contact to N+ source region 70' only at wall 94, a shallower etch depth of between about 0.25 and 0.4 micrometers would be preferred. This is to prevent extensive lateral etching of N+ source region 70' at wall location 94, which might result in difficulty in applying source metallization to wall 94 of N+ source 70'.

Figure 7:
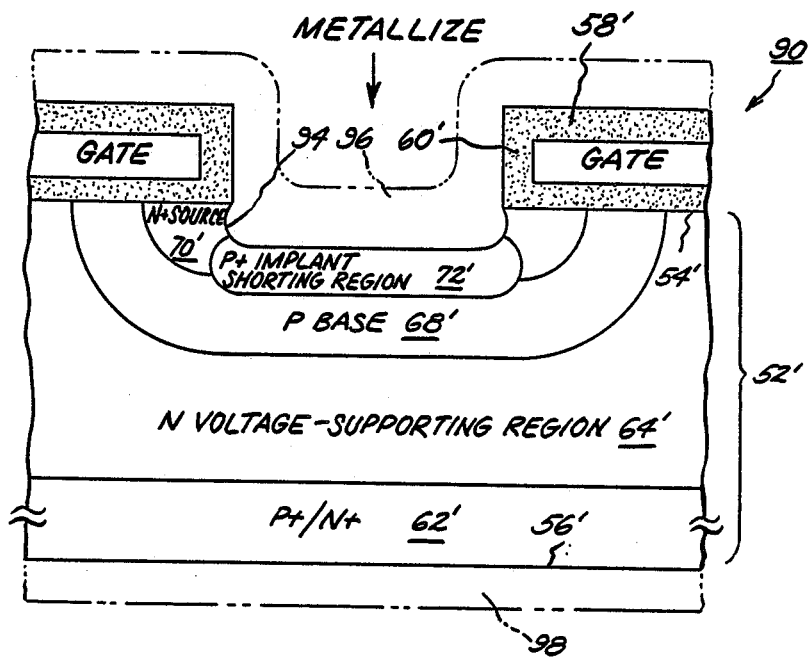
FIG. 7 is a view similar to FIG. 6 showing a further processing step for the device of FIG. 6.

After completion of the etch step of FIG. 6, device 90 is metallized as shown in FIG. 7 with source metallization 96, shown in phantom, which adjoins N+ source 70' at wall 94 and also the upper portion of P+ implant shorting region 72'. Drain metallization 98, shown in phantom and adjoining lowermost region 62', may be provided at this time or at another convenient time in the process of fabricating device 90, as will be apparent to those skilled in the art. The completed semiconductor device 90 is illustrated in FIG. 8.

Figure 8:
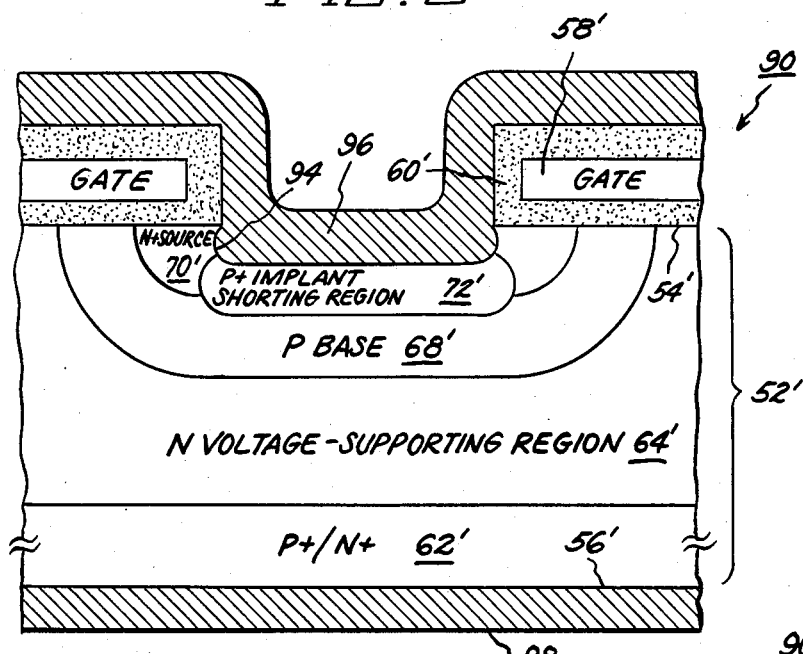
FIG. 8 is a schematic, cross-sectional view of the semiconductor device of FIGS. 6 and 7 when completed.
Figure 9:
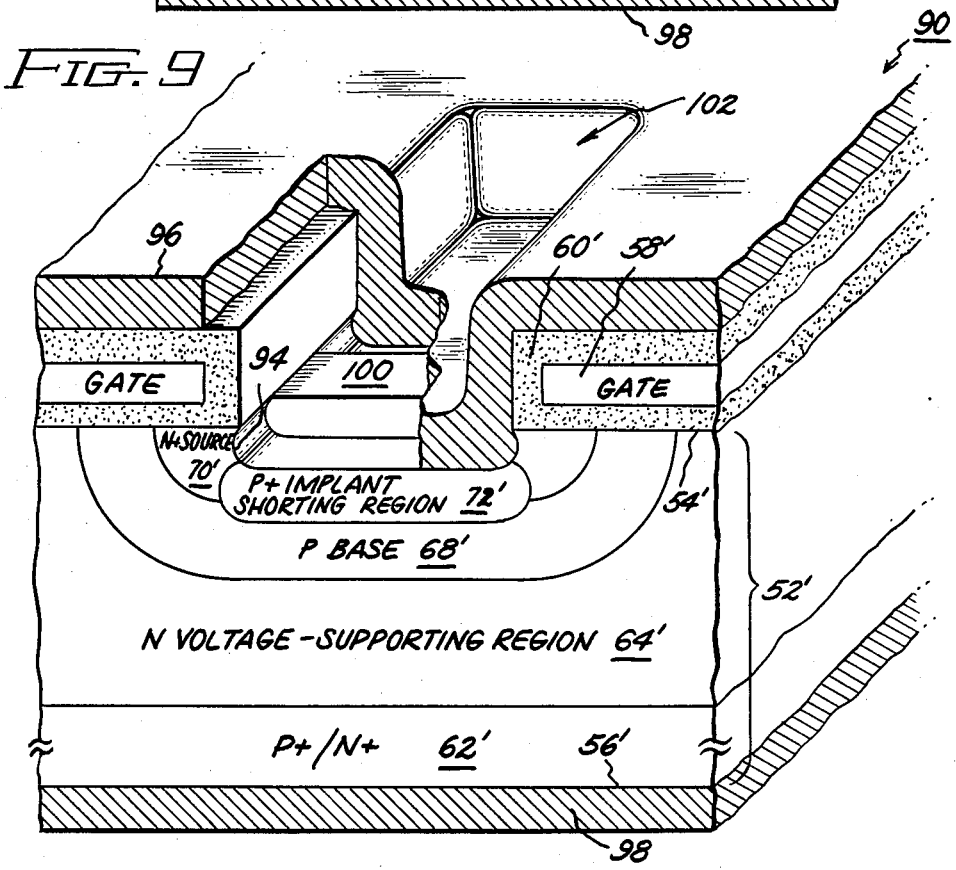
FIG. 9 is a schematic, tridimensional view in cross section of a modification of the semiconductor device of FIGS. 6-8 with a portion of the source electrode broken away to facilitate viewing of details of the modified device.

A preferred modification of semiconductor device 90 of FIG. 8 is illustrated in the tridimensional view of FIG. 9. Although shown partially broken away for clarity, source electrode 96 contacts N+ source 70' at wall 94, but additionally contacts source region 70' at portion 100 of N+ source region 70', which is not etched in the etch step of FIG. 6. Portion 100 of N+ source region 70' may be provided in a convenient manner by using as an etching mask in the etch step of FIG. 6 a grid of parallel lines (for example, 4 micrometers wide with 4 micrometers spacing), that are oriented generally orthogonal to the longitudinal axis of rectangular opening 102 (FIG. 9) in gate 58'.

Turning now to FIG. 10, there is shown a semiconductor device 110 in accordance with another embodiment of the invention, with like reference numerals as between device 110 (FIG. 10) and device 90' (FIG. 9) referring to like parts. In device 110, source electrode 96' contacts N+ source region 70" only at portion 100'. This portion 100' is suitably formed by using as an implanting mask (when implanting P+ regions 72", 112 and 114) a grid of parallel lines (for example, 4 micrometers wide with 4 micrometers spacing), that are oriented generally orthogonal to the longitudinal axis of rectangular opening 102' in gate 58". Source electrode 96' is conductively coupled to P+ implant shorting region 72" via a highly conductive path comprising P+ implant regions 112 and 114, which are formed at lesser implant energies than region 72". While two P+ implants (112 and 114) are illustrated, a single implant or more than two implants may be used with the criterion being that these implants provide a highly conductive path between source electrode 96' and P+ implant shorting region 72".

In FIG. 11 there is shown a semiconductor device 200 incorporating features of the present invention together with a feature of the prior art semiconductor device of FIG. 1. Like reference numerals as between device 200 (FIG. 11) and device 10 (FIG. 1) refer to like parts. Device 200 includes a P+ implant shorting region 202 in accordance with the present invention, and, additionally, a P+ shorting region 42' in accordance with the prior art device 10.

The center 206 of P+ implant shorting region 202 as viewed from above the device is shown as being in contact with wafer upper surface 14', which may result, for example, from P+ implant shorting region 202 being implanted through a thick oxide (not shown) previously located directly above center region 206. Such thick oxide may be a thermally-grown oxide covering the opening of a mask (not shown) used in forming P+ shorting region 42' and also N+ source region 28'.

Although the cell size of device 200 is typically as large as the cell size of device 10, where device 200 comprises an IGT (with lowermost region 32' being of P-conductivity type), it is less likely to latch into an on state as compared with prior art IGT device 10. This is because hole current (not shown) that flows from P base 26' to source electrode 22' encounters more highly conductive P-conductivity type material (i.e., both regions 42' and 202) than does hole current 38 of FIG. 1 in its path from P base 26 to source electrode 22 (i.e., only region 42).

In a preferred modification of semiconductor device 200 (FIG. 11), P+ shorting region 42' is made shallower than is the case for corresponding P+ shorting region 42 of prior art device 10 (FIG. 1), or is entirely omitted (not shown). This is a permissable modification of device 200 since P+ implant shorting region 202 together with source electrode 271, which is contacted by region 202 at wafer upper surface 14', are adequate to implement a base-to-source electrode short in device 200. A beneficial consequence of making P+ shorting region 42' shallower or of omitting it entirely from device 200 is that device 200 can then be made with a smaller cell size.

The foregoing describes semiconductor devices with improved base-to-source electrode shorts that provide superior device performance while being simple to fabricate and permitting a smaller device cell size.

While the invention has been described with respect to specific embodiments by way of illustration, many modifications and changes will occur to those skilled in the art. For example, complementary semiconductor devices could be fabricated wherein P-conductivity type material is used instead of N-conductivity type material, and vice-versa. It is, therefore, to be understood that the appended claims are intended to cover the foregoing and all such modifications and changes as fall within the true spirit and scope of the invention.

I claim:

1. An insulated-gate semiconductor device with an improved base-to-source electrode short, comprising:

a semiconductor wafer having a substantially planar upper surface;

a voltage-supporting layer of one conductivity type included in said wafer;

a base region of opposite conductivity type included in said wafer, overlying said voltage-supporting layer, and having a portion extending into proximity to or to said upper surface;

a source region of said one conductivity type included in said wafer and overlying said base region;

a channel region included in said wafer along said base region at said upper surface and extending between said voltage-supporting layer and said source region;

said substantially planar upper surface including surface portions of said voltage-supporting layer, said channel region and said source region;

a gate insulatingly spaced above said channel region of said wafer, said gate having an aperture therein having a predetermined shape;

a source electrode situated above said wafer and conductively coupled to said source region within the lateral confines of said aperture; and an implanted shorting region of said opposite conductivity type included in said wafer beneath said aperture adjoining both said source and base regions, having a higher conductivity than said base region, being spaced from said voltage-supporting layer and conductively coupled to said source electrode and having a dopant profile in which the region of maximum concentration of the dopant creating said implanted shorting region is within said wafer and spaced from said upper surface of said wafer.

2. An insulated-gate semiconductor device with an improved base-to-source electrode short, comprising:
   a semiconductor wafer having a substantially planar upper surface;
   a voltage-supporting layer of one conductivity type included in said wafer;
   a base region of opposite conductivity type included in said wafer atop said voltage-supporting layer, and having a portion terminating at said upper surface;
   a source region of said one conductivity type included in said wafer and overlying said base region;
   said substantially planar upper surface comprising surface portions of said voltage-supporting layer, said base region and said source region;
   a gate insulatingly spaced above said wafer over said surface portion of said base region, said gate having an opening therein having a predetermined shape;
   a source electrode situated above said wafer and conductively coupled to said source region within said opening; and
   an implanted shorting region of said opposite conductivity type beneath said opening and being spaced from said voltage-supporting layer, having a dopant profile in which the region of maximum concentration of the dopant creating said implanted shorting region is within said wafer and spaced from said upper surface of said wafer and exhibiting a lower concentration in proximity to said upper surface, said implanted shorting region adjoining both said source and base regions and having a higher conductivity than said base region.

3. The semiconductor device of claim 1 further comprising a conductive metal-semiconductor eutectic composition conductively interconnecting said source electrode and said implanted shorting region.

4. The semiconductor device of claim 1 wherein said source electrode adjoins said implanted shorting region and portions of said source region at respective locations beneath the plane of said wafer upper surface.

5. The semiconductor device of claim 4 wherein said source electrode further adjoins said source region at the plane of said wafer upper surface.

6. The semiconductor device of claim 1 further comprising at least one further implanted region of said opposite conductivity type included in said wafer, said at least one further implanted region having an upper surface contiguous with said wafer upper surface and a lower surface adjoining said first recited implanted shorting region, said source electrode adjoining said further implanted region at said wafer upper surface and further adjoining said source region at said wafer upper surface.

7. The semiconductor device of claim 1 further comprising a second implanted shorting region in said wafer laterally adjoining said base region and at least the major portion thereof adjoining both said first recited implanted shorting region and said voltage-supporting layer.

8. The semiconductor device of claim 7 further comprising:
   a minority-carrier injection region in said wafer of said opposite conductivity type and underlying said voltage-supporting layer; and
   a drain electrode underlying said minority-carrier injection region.

9. The semiconductor device of claim 1 wherein said source region and said voltage-supporting layer comprise seimconductor material of N-conductivity type and said base and implanted shorting regions comprise semiconductor material of P-conductivity type.

10. The semiconductor device of claim 9 wherein said wafer comprises silicon semiconductor material.

11. The insulated gate semiconductor device of claim 1 wherein said entire implanted shorting region is spaced from said substantially planar upper surface of said semiconductor wafer.

12. The insulated gate semiconductor device of claim 2 wherein said implanted shorting region is substantially parallel to said upper surface and coextensive with said source region.

13. The insulated gate semiconductor device of claim 12 wherein a first portion of said implanted shorting region includes an upper surface coplanar with the upper surface of the source region and a second portion of said implanted shorting region includes an upper surface spaced from the upper surface of the source region.

14. The insulated gate semiconductor device of claim 2 wherein said base region adjacent said surface is contiguous with said source region.

15. The insulated gate semiconductor device of claim 2 wherein said implanted region is spaced from said upper surface.

16. The insulated gate semiconductor device of claim 2 wherein said implanted region overlaps a substantial portion of said source and base regions.

17. The insulated gate semiconductor device recited in claim 1 wherein the lateral boundary of said implanted shorting region has substantially the same shape as the boundary of said aperture.

18. The insulated gate semiconductor device recited in claim 1 wherein said maximum concentration of said implanted shorting region dopant is at least an order of magnitude greater than the concentration of its dopant at said substantially planar upper surface of said semiconductor device.

19. The insulated gate semiconductor device recited in claim 1 wherein said implanted shorting region is spaced from said channel region.

20. The insulated gate semiconductor device recited in claim 6 wherein both said first recited and said further implanted shorting regions are spaced from said channel region.

21. The insulated gate semiconductor device recited in claim 7 wherein both said first recited and said second implanted shorting regions are spaced from said channel region.

22. The insulated gate semiconductor device recited in claim 2 wherein the lateral boundary of said implanted shorting region has substantially the same shape as the boundary of said opening.

23. The insulated gate semiconductor device recited in claim 2 wherein said maximum concentration of said implanted shorting region dopant is at least an order of magnitude greater than the concentration of its dopant at said substantially planar upper surface of said semiconductor device.

24. The semiconductor device of claim 1 wherein said base region, said source region and said implanted shorting region are all self aligned with respect to said aperture in said gate.

25. The semiconductor device of claim 24 wherein:
said base region, said source region and said implanted shorting region each extend laterally beneath said gate from said aperture;
said base region extends laterally under said gate electrode a greater distance than either said source region or said implanted shorting region; and
said source region extends a greater distance laterally under said gate than said implanted shorting region and said implanted shorting region overlaps the dopant distributions which create said base and source regions.

26. The semiconductor device of claim 25 wherein said implanted shorting region is spaced from said upper surface by a portion of said source region and enhances the doping of said base region where it overlaps said base region and converts a portion of said source region where it overlaps said source region to said opposite type conductivity.

* * * * *